United States Patent [19]

Love et al.

[11] Patent Number: 5,185,721
[45] Date of Patent: Feb. 9, 1993

[54] CHARGE-RETAINING SIGNAL BOOSTING CIRCUIT AND METHOD

[75] Inventors: Andrew M. Love, Stafford, Tex.; David V. Kersh, III, Houston, both of Tex.

[73] Assignee: Texas Instruments Incorporated, Dallas, Tex.

[21] Appl. No.: 453,335

[22] Filed: Dec. 19, 1989

Related U.S. Application Data

[63] Continuation of Ser. No. 265,366, Oct. 31, 1988, abandoned.

[51] Int. Cl.⁵ .................. G11C 7/00; G11C 11/413; G11C 5/14
[52] U.S. Cl. .................. 365/189.06; 365/149; 365/189.11; 365/203; 365/204; 307/296.5
[58] Field of Search .............. 365/203, 204, 189.11, 365/189.06, 226, 227, 222, 149; 307/296.1, 296.5, 296.8, 304

[56] References Cited

U.S. PATENT DOCUMENTS

| | | | |
|---|---|---|---|
| 3,623,031 | 11/1971 | Kumada | 365/145 |
| 3,942,047 | 3/1976 | Buchanan | 307/296 |
| 4,149,232 | 4/1979 | Eaton, Jr. | 363/60 |
| 4,404,661 | 9/1983 | Nagayama et al. | 365/204 X |
| 4,455,493 | 6/1984 | Murton et al. | 307/304 X |
| 4,503,522 | 3/1985 | Etoh et al. | 365/204 X |
| 4,583,157 | 4/1986 | Kirsch et al. | 363/60 |
| 4,636,981 | 1/1987 | Ogura | 365/189.11 |
| 4,638,182 | 1/1987 | McAdams | 365/226 X |
| 4,677,313 | 6/1987 | Mimoto | 365/203 X |
| 4,703,196 | 10/1987 | Arakawa | 307/296.8 X |
| 4,707,625 | 11/1987 | Yanagisawa | 365/203 X |
| 4,736,121 | 4/1988 | Cini et al. | 307/296.1 |
| 4,763,301 | 8/1988 | Schuetz | 365/203 X |
| 4,769,792 | 9/1988 | Nogami et al. | 365/222 |
| 4,787,066 | 11/1988 | Leuschner | 365/149 |
| 4,788,664 | 11/1988 | Tobita | 365/189.06 X |
| 4,792,928 | 12/1988 | Tobita | 365/189.11 X |
| 4,831,257 | 5/1989 | McClelland et al. | 307/296.1 X |
| 4,878,201 | 10/1989 | Nakaizumi | 365/203 |
| 4,896,297 | 1/1990 | Miyatake et al. | 365/204 X |
| 4,916,334 | 4/1990 | Minagawa et al. | 365/189.1 X |
| 4,954,731 | 9/1990 | Dhong et al. | 365/204 X |
| 5,012,445 | 4/1991 | Kazuaki et al. | 365/189.06 |

FOREIGN PATENT DOCUMENTS 0030813 6/1981 European Pat. Off. .
61-85699 5/1986 Japan .

OTHER PUBLICATIONS

IBM-TDB-vol. 28, No. 6,; Nov. 1985 "Simple Word Line Boosting Circuit for High Performance CMOS DRAM's".

Primary Examiner—Alyssa H. Bowler
Attorney, Agent, or Firm—Ronald O. Neerings; James C. Kesterson; Richard L. Donaldson

[57] ABSTRACT

During an active phase of operation of the circuit (70), a gate (38) of a transistor (14) is boosted to a first voltage level that is substantially above the voltage supply level ($V_{dd}$). After the gate (38) is boosted, the signal node (12) is boosted by transmitting current through the current path of the transistor (14) from a first electrode (16) of a boosting capacitor (18). During a reset phase of operation of the circuit (70), a second electrode (26) of the capacitor (18) is discharged. This causes the withdrawl of the charge from the signal node (12) through the current path of the transistor (14) to the first electrode (16) of the boosting capacitor (18). A predetermined voltage level near the voltage supply level is established across the electrodes (16, 26) of the boosting capacitor (18) in response to this. Finally, the transistor gate (38) is discharged to isolate the boosting capacitor (18) from the node (12), such that the desired voltage level is maintained across the boosting capacitor (18) for an extended length of time.

36 Claims, 2 Drawing Sheets

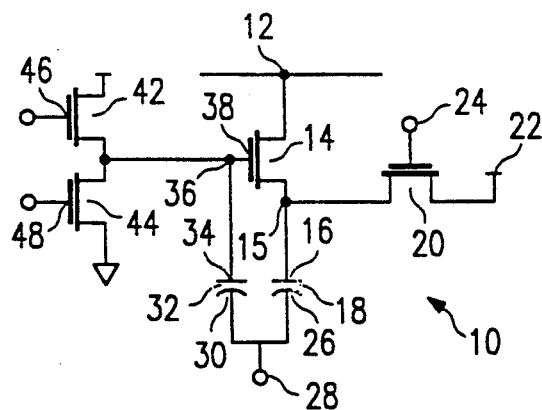
FIG. 1
*(PRIOR ART)*
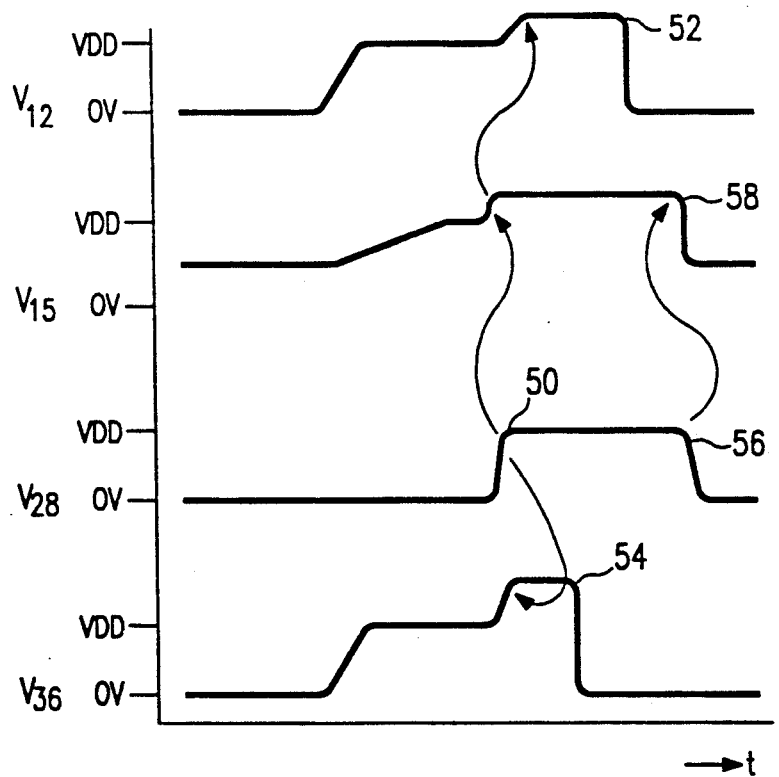
FIG. 2a
*(PRIOR ART)*
FIG. 2b
*(PRIOR ART)*
FIG. 2c
*(PRIOR ART)*
FIG. 2d
*(PRIOR ART)*

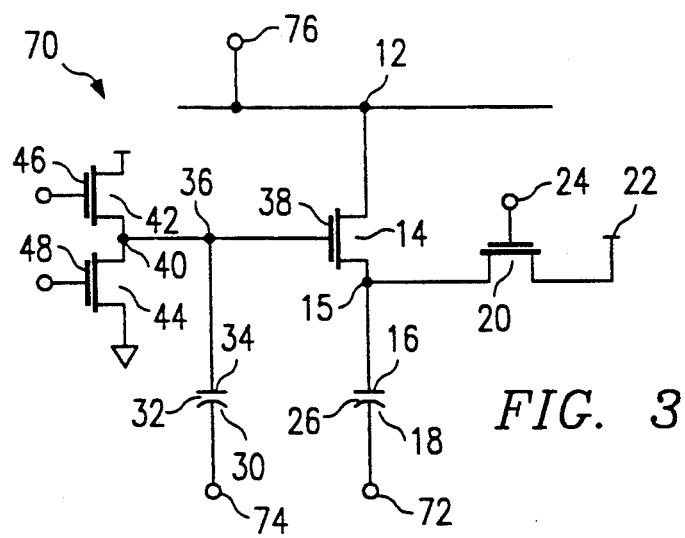
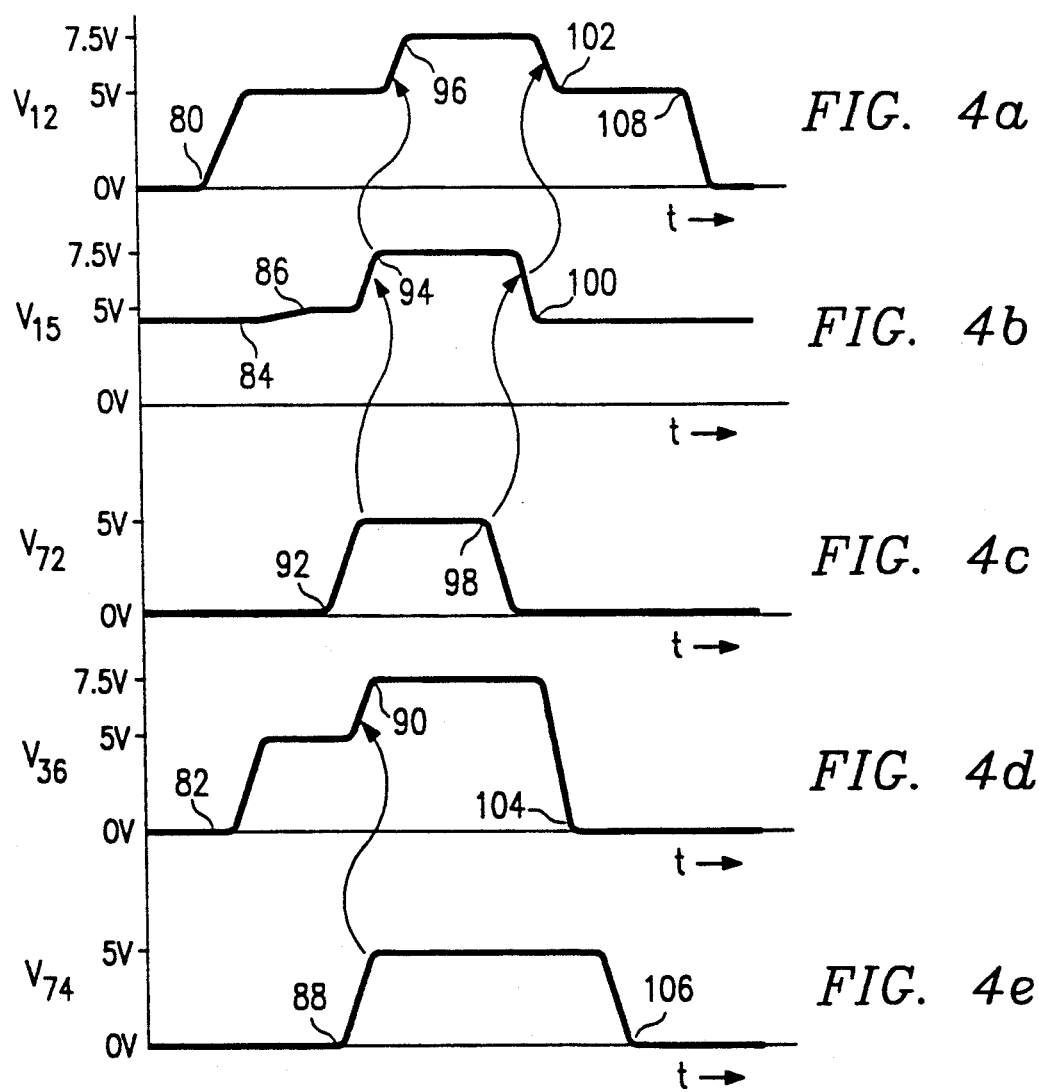
FIG. 3
FIG. 4a
FIG. 4b
FIG. 4c
FIG. 4d
FIG. 4e

CHARGE-RETAINING SIGNAL BOOSTING CIRCUIT AND METHOD

This application is a continuation of application Ser. No. 07/265,366, filed Oct. 31, 1988, now abandoned.

TECHNICAL FIELD OF THE INVENTION

The present invention relates in general to boosting voltage on a node in an integrated circuit to a voltage level above the supply voltage level, and more particularly relates to a method and apparatus for retaining a substantial amount of charge on a boosting capacitor in a DRAM.

BACKGROUND OF THE INVENTION

It is now common practice in dynamic random access memories (DRAMs) to boost voltage on a word line to above $V_{dd}$ in order to store a full memory charge into the memory cells associated with the boosted word line during an "active restore" phase of the DRAM operation. It is often desirable in these and other integrated circuits to boost other nodes to a voltage above the $V_{dd}$ or voltage supply level as well.

Driving and boosting heavily loaded signal lines, however, requires a large amount of power. In a conventional boosting design, a boosting capacitor is connected between the node to be boosted and a switched voltage supply source such as an internal signal that swings from zero volts to $V_{dd}$. The capacitance signal node to be boosted is at the supply voltage $V_{dd}$. Then, the voltage supply is applied to one electrode of the boosting capacitor driving the other electrode of the capacitor to a voltage level boosted above $V_{dd}$. Since this second electrode is connected directly to the signal node, the signal node also is boosted above the $V_{dd}$ level.

One disadvantage of this method is that the large boosting capacitor generally required is completely charged and discharged during every cycle of operation. Large amounts of power are consumed. Another disadvantage is that the charging of the signal node is slowed because the boosting capacitor is permanently connected thereto, thereby adding to the RC time constant.

One conventional solution to the above problem is to connect the boosting capacitor to the signal node through a transistor with a gate electrode that is boosted at an appropriate time by a second capacitor. As will be described in more detail below, this conventional solution stores a less than optimum voltage level on the boosting capacitor during the reset phase of the operation cycle. A need has therefore arisen for a node voltage-boosting circuit that will isolate the boosting capacitor from the signal node while the signal node is being charged to $V_{dd}$, and will retain substantial charge in the boosting capacitor during the reset phase of the operation cycle.

SUMMARY OF THE INVENTION

One aspect of the invention comprises an apparatus for boosting a signal node to a first voltage level substantially above a voltage supply level. A transistor has a current path that is used to selectively couple the first electrode of a boosting capacitor to the signal node. A first circuit is provided for boosting the control electrode of the transistor to a voltage level that is also substantially above the voltage supply level. A second circuit that includes the boosting capacitor boosts the voltage on the signal node to the first, boosted voltage level by raising a second electrode of the boosting capacitor to a voltage near the voltage supply level sometime after the first circuit boosts the voltage on the control electrode of the transistor. A third circuit decreases the voltage on the second electrode of the boosting capacitor to a voltage level substantially lower than the voltage supply level at a time after the voltage on the signal node is boosted. This causes the withdrawal of charge from the signal node through the current path to the first electrode of the boosting capacitor, and maintains across the boosting capacitor a voltage difference that approximates the voltage supply level. A fourth circuit next decreases the voltage the control electrode of the transistor to a voltage level below the threshold operating voltage of the transistor, such that a voltage difference will be maintained across the boosting capacitor electrodes for an extended period of time.

In another aspect of the invention, the first circuit that boosts the control electrode of the transistor includes a second capacitor. The boosting of the voltage on the control electrode of the transistor is effected by impressing a supply voltage level on one electrode of the second capacitor, and boosting the second electrode of the second capacitor to an elevated level by capacitive coupling, which elevated level is applied to the control electrode of the transistor. Both electrodes of the second capacitor are discharged at the time that the control electrode of the transistor is discharged.

A principal advantage of the present invention is its independent control of the second capacitor and the boosting capacitor. A boosted level is allowed to be maintained at the control electrode or gate of the pass transistor while one electrode of the boosting capacitor is discharged. This pulls charge off of the signal node and back through the transistor current path to the boosting capacitor. This charge transfer helps to discharge the signal node while at the same time allowing the saving of almost a full $V_{dd}$ charge on the boosting capacitor. The gate electrode of the transistor is then discharged, thus turning off the transistor, isolating the boosting capacitor from the signal node and maintaining this almost full $V_{dd}$ charge until the next operating cycle.

BRIEF DESCRIPTION OF THE DRAWINGS

Other aspects of the invention and their advantages will be discerned from the following detailed description taken in conjunction with the drawings in which:

FIG. 1 is an electrical schematic diagram of a prior art signal node boosting circuit;

FIGS. 2a-2d are timing diagrams of various nodes within the circuit illustrated in FIG. 1, showing the operation thereof;

FIG. 3 is an electrical schematic diagram of a signal node boosting circuit according to the invention; and FIGS. 4a-4e are timing diagrams showing voltage levels at various nodes in the circuit of FIG. 3 during active and reset cycles of operation thereof.

DETAILED DESCRIPTION OF THE INVENTION

A prior art boosting circuit is indicated generally at 10 in FIG. 1. The circuit 10 is coupled to a signal node 12, which for example can be a signal line. More particularly, signal node 12 can be connected to a row line in a dynamic random access memory (DRAM) through a row decoder pass gate (not shown), which row line will have a plurality of memory cells (not shown) coupled thereto. In this last case, it is important to boost the voltage of the row line 12 above the supply voltage $V_{dd}$ in order to assure the storage of a full $V_{dd}$ inside certain capacitors (not shown) of the memory cells. In addition to the cell capacitance, there is an effective capacitance between the row line and ground reference potential.

In the boosting circuit, a current path of an n-channel field-effect transistor 14 is operable to connect the signal node 12 to a first electrode 16 of a boosting capacitor 18. The electrode 16 is also connected through a switching transistor 20 to a voltage supply 22 such as $V_{dd}$. The switching transistor 20 has a gate 24 connected to a control signal source (not shown).

A second electrode 26 of the boosting capacitor 18 is connected to a control signal node 28. A control circuit (not shown) alternately applies the voltage $V_{dd}$ through the node 28 to the electrode 26 or discharges the electrode 26 to ground, at different predetermined times. The construction of such a control circuit is conventional, and is therefore not described here.

The control signal node 28 is further connected to an electrode 30 of a second capacitor 32. An opposed electrode 34 of capacitor 32 is connected to a node 36. Node 36 is connected to a gate 38 of the transistor 14, to $V_{dd}$ through an NMOS transistor 42, and to ground through a further NMOS transistor 44. A gate 46 of the transistor 42 is connected to a signal source (not shown) that is capable of selectively impressing a voltage level on the gate 46 that substantially exceeds $V_{dd}$. A gate 48 of the transistor 44 is controlled by a signal source (not shown) that is capable of actuating the transistor 44 to pull node 36 to ground.

The operation of this prior art boosting circuit can be best described in conjunction with FIGS. 2a-2d, which are timing diagrams of signal node 12, boosting node 15, control node 28 and gate node 36 within the circuit of FIG. 1 during precharge, active and reset portions of a DRAM operating cycle. The diagrams show voltage versus time, with $V_{dd}$ typically being about 5 volts. The time for an entire operation cycle is typically about 100 nanoseconds.

During a precharge phase of operation, the transistor 14 is off and a charge of approximately one-half of $V_{dd}$ exists across the electrodes 16 and 26 of the capacitor 18. In an active phase following the precharge phase, the node 15 is driven slowly to $V_{dd}$ by the actuation of transistor 20 by a higher-than-$V_{dd}$ control signal at node 24. At about the same time, the gate node 36 is raised to $V_{dd}$ through the action of a boosted signal on the gate 46 of the transistor 42, and signal node 12 is driven to $V_{dd}$.

At a time 50, the control node 28 is raised from zero volts to $V_{dd}$, and thus $V_{dd}$ will exist at the electrodes 26 and 30. This in turn causes an elevated voltage to appear on the electrodes 16 and 34 of respective capacitors 18 and 32 through capacitive coupling.

Voltages elevated above $V_{dd}$ will therefore appear at nodes 15 and 36. The elevated voltage impressed on the gate 38 of the transistor 14 will in turn allow the transmission of an elevated voltage level onto the signal node 12. In the case where $V_{dd}$ is 5 volts, for example, the elevated voltage may be approximately 7.5 volts.

The signal node 12 and the gate node 36 are next discharged to ground at respective times 52 and 54. At a later time 56, the voltage at node 28 is dropped from $V_{dd}$ to zero volts, which in turn discharges the electrodes 26 and 30 to ground. The capacitor 18 is allowed to remain charged to a voltage equal to the difference between the boosted voltage level that had existed at node 12 and $V_{dd}$, which in turn is approximately equal to one-half of $V_{dd}$. Therefore, the voltage with respect to, ground of node 15 will fall to one-half $V_{dd}$ as is shown at 58. A disadvantage of this prior art method is that only approximately one-half of the voltage supply level is allowed to be stored across the electrodes 16 and 26 of the boosting capacitor 18.

Turning now to FIG. 3, a detailed electrical schematic diagram is shown of the invention's boosting circuit indicated generally at 70. The circuit of FIG. 3 is somewhat similar to that shown in FIG. 1, and therefore like numbers have been used to identify like parts wherever possible. A description of the main structural differences between the circuits shown in FIGS. 1 and 3 will suffice.

In FIG. 3, a first control signal is applied through a control signal node 72 and a second control signal is applied through a control signal node 74. Control signal generating circuitry (not shown) of conventional design is connected to node 24, gates 46 and 48, and nodes 72, 74 and control circuit 76 to impress different control signals thereon at preselected times. This generating circuitry may include a controller for generating a plurality of drive signals and for controlling a plurality of switching transistors connected to respective ones of the nodes 24, 46, 48, 72, 74 and 12 that are actuated by the drive signals. The control signal node 72 is connected only to the second electrode 26 of the boosting capacitor 18, while control signal node 74 is connected only to the second electrode 30 of the second capacitor 32. The control signals transmitted through nodes 72 and 74 are operated independently, as will be further explained in conjunction with FIGS. 4a-4e.

FIGS. 4a-4e set out a series of timing diagrams that show the voltage levels at nodes 12, 15, 72, 36 and 74, respectively, during the reset and active cycles of operation of the circuit. The voltage at node 15 begins at approximately 4.5 volts as an effect from the charging of the boosting capacitor 18 from the prior cycle. Node 12 begins in a discharged condition at zero volts, as do nodes 72, 36 and 74.

At a time 80, the voltage level at the signal node 12 begins to be raised to five volts, or $V_{dd}$, through a drive signal source 76 connected to node 12. The voltage at node 36 begins to rise at a time 82 that may be at or slightly after time 80. The voltage level at node 36 will appear at transistor gate 38 and electrode 34. $V_{dd}$ appears at node 36 by means of the application of a boosted voltage level to the gate 46 of the transistor 42.

Control signal boosts node 24 to a voltage above $V_{dd}$ at time 84 (see FIG. 4b), which causes node 15 to begin to rise to a full $V_{dd}$ level. The charge up to a full $V_{dd}$ is completed at a time 86.

At a time before time 88 (FIG. 4e), the gate 46 of transistor 42 and the gate 24 of transistor 20 are discharged from their boosted states to $V_{dd}$, or more preferably ground. Then, at a time 88 shortly after time 86, the voltage at the control signal node 74 is raised from 0 volts to 5 volts, in turn causing the occurrence of a boosted voltage at node 36 by capacitive coupling at time 90. At a time 92 that may be simultaneous with time 88, the voltage at node 72 begins to be raised from 0 to 5 volts, in turn causing an elevated level to appear at the node 15 by capacitive coupling at a time 94. Once both times 90 and 94 have been reached, a boosted voltage level will begin to be communicated to the signal node 12, and a boosted voltage level will be fully achieved by a time 96.

A reset portion of the cycle begins on or before a time 98, at which point the control signal node 72 begins to be pulled down from 5 volts to ground. The discharge of the capacitor electrode 26 in turn causes a drop of the voltage level at the node 15 by a time 100 to a level slightly below $V_{dd}$ by capacitive coupling. This in turn causes the withdrawal of charge from the signal node 12 through the current path of the transistor 14 to the node 15. The signal node 12 will therefore be back at approximately $V_{dd}$ by a time 102. The withdrawal of charge off of the signal node 12, however, allows the maintenance of an almost full $V_{dd}$ voltage level across the electrodes 16 and 26 of the boosting capacitor 18. In another embodiment, node 72 may be pulled down to a voltage other than ground such that the stored voltage is other than $V_{dd}$.

The voltage at the node 36 is next discharged to ground through the grounding transistor 44 at a time 104, which is after time 102. This causes the first electrode 34 of the second capacitor 32, as well as the gate 38 of the transistor 14, to become discharged. At a time 106 that is after time 102 and which may be simultaneous with the time 104, the node 74 is discharged, thereby discharging the capacitor electrode 30. The charging and discharging of the second capacitor 32 is not expensive in terms of power since it is much smaller than the principal boosting capacitor 18.

The discharging of the gate node 36 turns off the transistor 14 and thus isolates the node 15 from the signal node 12. At a time 108, therefore, the node 12 may be discharged back to zero without affecting the voltage level that exists across the boosting capacitor 18. The voltage appearing across electrodes 16 and 26, which is at this point the same as the voltage with respect to ground of node 15, will be approximately 4.5 volts. If five or ten nanoseconds are added to the cycle between time 98 and time 103, a full $V_{dd}$ could be stored on the boosting capacitor 18.

It can be seen that the dissipation of large amounts of power in the charging and recharging of the boosting capacitor 18 has been avoided. Since the boosting capacitor 18 is isolated from the signal node 12, the signal node 12 can be driven high faster.

In an alternative embodiment (not shown), two or more circuits 70 may be coupled to the node 12 instead of just one. For example, during a first cycle, a first of these circuits 70 would be used to boost node 12 and a second circuit 70 would draw charge from the node 12 for its boosting capacitor 16. The roles would then be reversed for the second cycle.

In summary, an advantageous boosting circuit has been disclosed that allows the preservation of almost a full $V_{dd}$ across the boosting capacitor by its independent boosting control of the gate of the pass gate transistor that connects the boosting capacitor to the signal node. The present invention has application to any node that is required to be boosted above an integrated circuit voltage supply level. Therefore, while one illustrated embodiment has been described above together with its advantages, the invention is not limited thereto but only by the scope and spirit of the appended claims.

What is claimed is:

1. Apparatus for preserving a predetermined voltage level near a voltage supply level on a boosting capacitor, comprising:
   a transistor having a current path and a gate, said current path operable to couple a first electrode of a boosting capacitor to a signal node;
   first circuitry for boosting the node to a boosted level above the voltage supply level;
   second circuitry for discharging a second electrode of the boosting capacitor to a first voltage level, such that charge is withdrawn through the transistor to said first electrode and a second voltage level exists on said first electrode, said capacitor storing a predetermined voltage level substantially equivalent to the difference between said first and second voltage levels; and
   third circuitry for discharging said gate to below a threshold voltage of said transistor, such that said capacitor is isolated from said node and such that said predetermined voltage level is maintained on said capacitor for an extended period of time.

2. Apparatus for boosting a node to a first voltage level substantially above a voltage supply level, comprising:
   a transistor having a control electrode;
   a boosting capacitor for being coupled through said transistor;
   a first circuit for boosting said control electrode to a voltage level above said voltage supply level at a first time;
   a second circuit operable in conjunction with said boosting capacitor for boosting said node to said first voltage level by raising the voltage level of a first electrode of said boosting capacitor to a second voltage level at a second time after said first time;
   a third circuit for discharging said first electrode to a voltage level lower than said second voltage level at a third time after said second time, such that charge will be withdrawn from said node through said transistor to establish a third voltage level near said voltage supply level across said boosting capacitor electrodes; and
   a fourth circuit for discharging said control electrode of said transistor to a voltage level below the threshold voltage of said transistor at a fourth time following said third time, such that a level near said third voltage level will be maintained across said boosting capacitor for an extended period of time.

3. The apparatus of claim 2, wherein said first circuit comprises a second capacitor, a first electrode of said second capacitor coupled to said control electrode of said transistor, a second electrode of said second capacitor selectively coupled to a voltage supply;
   said first circuit operable to connect said voltage supply to said second electrode of said second capacitor at said first time such that said first electrode of said second capacitor and said control electrode are capacitively coupled to said voltage level above said voltage supply level.

4. The apparatus of claim 3, wherein said first circuit further comprises a discharge circuit for discharging said second electrode of said second capacitor at a time not after said fourth time, such that said control electrode of said transistor and said first electrode of said second capacitor become capacitively coupled down to a voltage level near said supply level.

5. The apparatus of claim 2, wherein a cycle of operation of said apparatus includes active and reset phases, a voltage level being retained by said boosting capacitor after said control electrode of said transistor has been discharged by said fourth circuit during said reset phase, the last said voltage level persisting until said second circuit raises the voltage level of said boosting capacitor during the active phase of the next operation cycle.

6. The apparatus of claim 2, wherein said second circuit comprises a voltage supply and a switch for selectively coupling said voltage supply to said first electrode of said boosting capacitor, said switch operable to connect said voltage supply to said first electrode of said boosting capacitor at a time not before said second time, such that a second electrode of said boosting capacitor is boosted to above said voltage supply level.

7. The apparatus of claim 2, wherein said first electrode of said boosting capacitor is discharged to about zero volts.

8. The apparatus of claim 2, wherein said control electrode of said transistor is discharged to about zero volts.

9. The apparatus of claim 2, wherein said first voltage level is approximately 1.5 times the magnitude of said voltage supply level.

10. The apparatus of claim 2, wherein said node is a conductor for transmitting a drive/boot signal to a plurality of row line circuits.

11. The apparatus of claim 2, wherein said voltage supply level is about five volts and said third voltage level is about 4.5 volts.

12. The apparatus of claim 2, and further comprising a fifth circuit for charging a second electrode of said boosting capacitor to said voltage supply level before said second time.

13. The apparatus of claim 2, and further comprising a sixth circuit for charging said node to said voltage supply level.

14. The apparatus of claim 2, wherein said first circuit is operable to bring said control electrode of said transistor to said supply voltage level prior to the boosting thereof.

15. The apparatus of claim 2, and further comprising circuitry for discharging said node after said fourth time.

16. In an integrated circuit, apparatus for preserving substantially a full voltage supply level on a boosting capacitor during a reset phase of operation, said boosting capacitor operable to boost a node above said voltage supply level, the apparatus comprising:

a transistor having a current path for selectively coupling a first electrode of said boosting capacitor to said node to boost said node to above said voltage supply level;

a second capacitor having first and second electrodes, a gate of said transistor coupled to said first electrode of said second capacitor for selectively boosting said gate above said voltage supply level;

first circuitry coupled to said first electrode of said boosting capacitor for impressing said voltage supply level thereon;

second circuitry for selectively charging said second electrode of said boosting capacitor to said voltage supply level in order to boost the voltage at said first electrode of said boosting capacitor to above said voltage supply level by capacitive coupling, and for discharging the second electrode of said boosting capacitor in order to capacitively couple said first electrode of said boosting capacitor back to a voltage level near said voltage supply level;

third circuitry for selectively charging said second electrode of said second capacitor to said voltage supply to capacitively couple said first electrode of said second capacitor to a voltage level above said voltage supply level, and for discharging the last said second electrode to ground to capacitively couple said first electrode of said second capacitor back to a level near its level before being coupled above said voltage supply level;

fourth circuitry for selectively charging said first electrode of said second capacitor to said voltage supply level and discharging said first electrode of said second capacitor to ground; and a controller for operating said second, third and fourth circuitry such that, in a reset phase of operation, said second electrode of said boosting capacitor is discharged before the discharge of said gate, and such that charge will be drawn through said current path of said transistor from said node to said first electrode of said boosting capacitor and cause said boosting capacitor to retain a voltage level near said voltage supply level after said gate of said transistor has been discharged.

17. The apparatus of claim 16, wherein said integrated circuit comprises a dynamic random access memory.

18. The apparatus of claim 16, wherein said integrated circuit comprises a static random access memory.

19. The apparatus of claim 16, wherein said integrated circuit comprises a programmable read-only memory.

20. The apparatus of claim 16, wherein said node is coupled to a row line in turn coupled to a plurality of memory cells.

21. The apparatus of claim 16, wherein said full voltage supply level is about five volts, said boosting capacitor operable to retain a voltage level of about 4.5 volts after said gate of said transistor has been discharged in said reset phase of operation.

22. The apparatus of claim 16, wherein a cycle of operation of said apparatus includes active and reset phases, a voltage level being retained by said boosting capacitor after said gate of said transistor has been discharged during said reset phase of operation the last said voltage level persisting until said first and second circuitry raise the voltage level of said boosting capacitor during the active phase of the next operation cycle.

23. The apparatus of claim 16, wherein said apparatus is operable to boost said node to approximately 7.5 volts.

24. A method for preserving a predetermined voltage level near a voltage supply level on a boosting capacitor for boosting a node, comprising the steps of:

boosting the node to a boosted level substantially above the voltage supply level;

discharging a second electrode of the capacitor to a first voltage level;

withdrawing charge from the node through a transistor to a first electrode of the boosting capacitor responsive to said step of discharging the second electrode thereby establishing a second voltage level on the first electrode, the first voltage level being chosen such that the difference between the first voltage level and the second voltage level is equal to or slightly greater than the predetermined voltage level; and thereafter discharging the gate of the transistor to a voltage level below the threshold voltage of the transistor to isolate, the boosting capacitor from the node, such that the predetermined voltage level is maintained across the boosting capacitor for an extended length of time.

25. The method of claim 24, and further including the steps of:

raising a second electrode of a second capacitor to the voltage supply level;

in response to said step of raising the second electrode, boosting the voltage level of a first electrode of the second capacitor to a boosted level above the voltage supply level; and transmitting the boosted level from the first electrode of the second capacitor to the gate of the transistor such that the current may flow from the boosting capacitor to the node.

26. The method of claim 25, and further comprising the step of bringing the voltage level of the gate to the voltage supply level prior to said step of boosting the gate.

27. The method of claim 24, wherein said step of boosting the node further comprises the step of raising the voltage level of a second electrode of the boosting capacitor to the voltage supply level in order to boost the voltage level of the first electrode thereof above the voltage supply level.

28. The method of claim 24, and further comprising the steps of:

bringing the node to the voltage supply level; and subsequently boosting the gate of the transistor to permit the boosted level to be transferred to the node.

29. The method of claim 24, and further comprising the step of bringing the first electrode of the boosting capacitor to the voltage supply level prior to said step of boosting the node.

30. The method of claim 24, and further comprising the step of discharging the node after said step of discharging the transistor gate.

31. A method for boosting a node to a first voltage level above a voltage supply level in an integrated circuit, comprising the steps of:

during an active phase of operation, bringing the potential at a gate of a transistor to the voltage supply level at a first time;

bringing the potential of a first electrode of a boosting capacitor to the voltage supply level at a second time;

bringing the potential of a second electrode of a second capacitor having a first electrode coupled to the gate to the voltage supply level at a third time after the first time;

boosting the potential of the first electrode of the second capacitor and of the gate to a voltage level near the first voltage level in response to said step of bringing the potential of the second electrode thereof to the voltage supply level;

fully coupling the first electrode of the boosting capacitor through a current path of the transistor to the node in response to said step of boosting the potential of the gate;

raising the potential of a second electrode of the boosting capacitor to the voltage supply level after the second time;

boosting the potential of the first electrode of the boosting capacitor to about the first voltage level in response to said step of bringing the potential of the second electrode of the boosting capacitor to the voltage supply level;

boosting the node to the first level in response to said steps of fully coupling and of boosting the first electrode of the boosting capacitor;

during a reset phase of operation after said step of boosting the node, discharging the second electrode of the boosting capacitor to a second voltage level substantially lower than the voltage supply level;

decreasing the voltage on the first electrode of the boosting capacitor to a third voltage level substantially higher than said second voltage level and near said voltage supply level in response to said step of discharging the second electrode of the boosting capacitor;

withdrawing charge from the node through the current path of the transistor to the first electrode of the boosting capacitor in response to said step of decreasing the voltage; and after said step of withdrawing charge, discharging the first and second electrodes of the second capacitor to a voltage level lower than the operating threshold of the transistor to isolate the boosting capacitor from the node, such that substantially the difference between the second voltage level and the third voltage level is retained across the boosting capacitor until the next active phase of operation.

32. Semiconductor chip comprising:

a boosting capacitor;

a node having a capacitive load storing charge, producing a voltage across the capacitive load at a magnitude exceeding a power supply voltage for the chip;

means for discharging the capacitive load to the boosting capacitor, thereby increasing a voltage across the boosting capacitor; and means for selectively retaining the increased voltage across the boosting capacitor for an extended period of time.

33. Apparatus comprising:

a boosting capacitor;

a transistor for selectively coupling the boosting capacitor to a node having a capacitive load;

means for enabling the transistor to discharge the boosting capacitor through the transistor to the node for increasing voltage on the node to a boosted voltage greater than a power supply voltage for the apparatus;

means for enabling the transistor to discharge the capacitive load of the boosted node through the transistor to the boosting capacitor, thereby increasing a voltage across the boosting capacitor; and means for disabling the transistor and trapping a quantity of charge remaining in the boosting capacitor for an extended period of time.

34. A semiconductor device comprising:

a transistor arranged for selectively coupling one terminal of a boosting capacitor to a signal node;

a first circuit, including an enabled conduction path from the boosting capacitor through the transistor to the signal node, for increasing voltage on the signal node to a value exceeding voltage of a power supply for the semiconductor device;

a second circuit, including an enabled conduction path from the signal node through the transistor to the boosting capacitor, for increasing a voltage between terminals of the boosting capacitor and thereby increasing charge stored in the boosting capacitor; and a third circuit for disabling the conductive path through the transistor and trapping a quantity of charge in the boosting capacitor for an extended period of time.

35. A semiconductor device arranged for saving a quantity of charge within a boosting capacitor in the device, the device comprising:

means for selectively coupling the boosting capacitor to a node having a capacitive load;

means for increasing voltage on the node to a boosted voltage greater than a voltage of a power supply for the device;

means for enabling the node to discharge to the boosting capacitor, thereby increasing a voltage across the boosting capacitor; and means for trapping a quantity of charge remaining in the boosting capacitor for an extended period of time.

36. A method for boosting voltage on a node in a semiconductor device including the steps of:

discharging a boosting capacitor to the node for boosting voltage on the node to a magnitude exceeding the voltage of a power supply for the device;

reducing voltage on an electrode of the boosting capacitor to a reference potential;

thereafter discharging the node to another electrode of the boosting capacitor for increasing a voltage difference between electrodes of the boosting capacitor; and then isolating the boosting capacitor from the node and maintaining the voltage difference between the first and second electrodes for an extended period of time.

* * * * *